Dec. 10, 1963 D. S. COCHRAN 3,114,112
TRANSISTOR AMPLIFIER HAVING OUTPUT POWER LIMITING
Filed Dec. 23, 1960
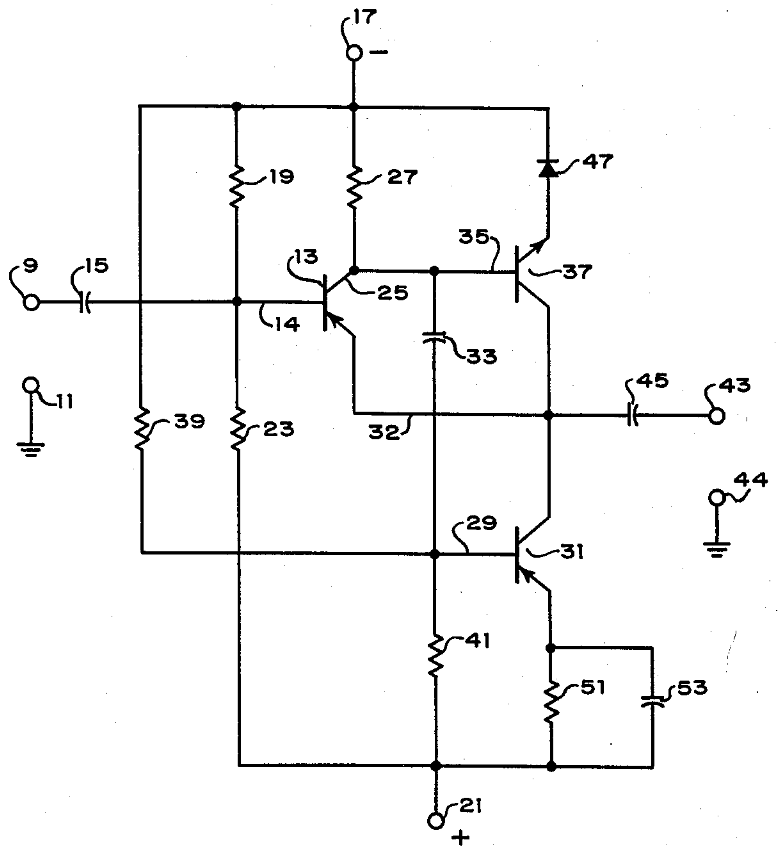
INVENTOR
DAVID S. COCHRAN
BY [signature]
ATTORNEY United States Patent Office 3,114,112
Patented Dec. 10, 1963

3,114,112

TRANSISTOR AMPLIFIER HAVING OUTPUT POWER LIMITING

David S. Cochran, Palo Alto, Calif., assignor to Hewlett-Packard Company, Palo Alto, Calif., a corporation of California Filed Dec. 23, 1960, Ser. No. 78,160
8 Claims. (Cl. 330—17)

This invention relates to transistor amplifiers which operate with high efficiency under large signal conditions and which have low output impedance for all values of output signal amplitude that are within the range of linear amplifier operation.

A power amplifier is generally designed to deliver undistorted signal power to a load or output circuit. The design requirements for signal gain in a power amplifier are usually considered subordinate to the requirements for high power amplification. Thus when signal gain is required in addition to power amplification, a signal amplifier is usually included as an added stage of amplification preceding the power amplifier. Many practical electronic systems, including radio and television systems, combine signal amplifiers and power amplifiers in this manner. The signal amplifier is primarily designed to increase the amplitude of applied signals and does not consume a great deal of electrical power. The power amplifier which is connected to receive the signal from the signal amplifier normally consumes a great deal of electrical power. The large amount of power consumed by the power amplifier is relatively unimportant in electronic circuits such as those in radio and television where the total power for the system is obtained from the power lines. However, a power amplifier that consumes large amounts of electrical power is a substantial drawback in battery operated equipment. In such equipment, low power consumption is highly desirable for long battery life. Thus when the equipment is required to operate in remote locations on battery power, it is desirable to use a power amplifier which can deliver the signal power to a load circuit with maximum efficiency and low power consumption.

The principal object of the present invention is to provide a transistor amplifier which has low power consumption and which operates at high efficiency under large signal conditions.

It is another object of the present invention to provide a transistor power amplifier which has low output impedance and high input impedance.

In accordance with the illustrated embodiment of the present invention, two transistors of complementary conductivity types are connected in the common emitter configuration. The transistors are biased to operate in opposite phase relationship. When one transistor is in the heavily conducting state, the other transistor is either in the slightly conducting or in the cut-off state. The amplified signal appearing at the common collector connection of the two transistors is fed back to the input circuit of a third or driver transistor. High loop gain thus attained serves to decrease the distortion and reduce the output impedance and serves to increase the input impedance.

Other and incidental objects of the present invention will be apparent from reading the specification and from an inspection of the accompanying drawing which shows a schematic diagram of the circuit of the present invention.

Referring now to the drawing, there is shown an input terminal 9 and a grounded input terminal 11. Input terminal 9 is connected to the base of transistor 13 through coupling capacitor 15. The base electrode 14 of transistor 13 is connected to one terminal 17 of a direct current power supply through resistor 19, and is connected to the other terminal 21 of a direct current power supply through resistor 23. The collector electrode 25 of transistor 13 is connected to power supply terminal 17 through resistor 27, and is connected to base electrode 29 of transistor 31 through capacitor 33, and is connected to the base electrode 35 of transistor 37. The base electrode 29 of transistor 31 is connected to terminal 17 of the power supply through resistor 39, and is connected to terminal 21 of the power supply through resistor 41. The collector electrodes of transistors 31 and 37 are connected together and are connected through line 32 to the emitter electrode of transistor 13. The common collectors are connected to output terminal 43 through coupling capacitor 45. The emitter electrode of transistor 37 is connected to power supply terminal 17 through diode 47. The emitter electrode of transistor 31 is connected to power supply terminal 21 through the parallel combination of resistor 51 and capacitor 53.

When no signal is present at input terminal 9, bias current flows from power supply terminal 21 through transistor 31 and through transistor 13 to power supply terminal 17. Transistor 31 is maintained in a forward biased condition by the voltage that is applied to the base electrode 29 through the voltage divider comprising resistors 39 and 41. Transistor 13 is connected to be forward biased by the voltage that is applied to base electrode 14 through the voltage divider comprising resistors 19 and 23. The voltage that appears across forward-biased diode 47 has a value that is substantially equal to the voltage that appears across resistor 27, which voltages serve to bias transistor 37 in the slightly conducting state. The forward voltage drop that appears across diode 47 adds to the voltage drop across the base-emitter junction of transistor 37. These voltages increase the voltage separation between the power supply voltage at terminal 17 and the voltage on collector 25. A large voltage separation permits the use of a large resistor 27, thereby providing greater possible signal gain from transistor 13. Coupling capacitor 45 precludes bias current from flowing into the load circuit connected between output terminal 43 and ground terminal 44.

Signal conducting means, such as coupling capacitor 15, is provided to apply signal appearing at input terminal 9 to the base electrode 14 of transistor 13. Direct current coupling may also be used to apply the signal to base electrode 14, if the no-signal bias conditions are maintained substantially unchanged. A positively increasing signal appearing at input terminal 9 causes the voltage appearing at collector electrode 25 of transistor 13 to decrease with time. The decreasing voltage appearing at collector electrode 25 is applied to base electrode 35 of transistor 37, and to base electrode 29 of transistor 31 through coupling capacitor 33. The decrease in the voltage at collector electrode 25 serves to bias transistor 37 into cut-off, and causes the voltage appearing at the collector electrode of transistor 31 to increase. The voltage appearing at the collector electrode of transistor 31 tends to change at a rate which is much larger than the rate of change of the voltage appearing at the base electrode 29. The changing voltage is applied to the load which is connected between output terminal 43 and ground terminal 44 through direct current coupling means or signal coupling means such as coupling capacitor 45. The voltage appearing at the emitter electrode of transistor 31 is maintained at a substantially constant value because of the large bypass capacitor 53 which is provided in shunt with emitter resistor 51. The change in the collector voltage of transistor 31 is fed back through line 32 to the emitter electrode of transistor 13.

A negatively changing voltage appearing at input terminal 9 causes the voltage appearing at collector electrode 25 to increase positively, thereby causing transistor 31 to cut off and transistor 37 to conduct more heavily. The positively changing signal appearing at base electrode 35 causes the voltage at collector electrode of transistor 37 to decrease at a rate which tends to be much larger than the rate of change of the voltage appearing at the base electrode 35. The decrease in voltage that appears at the collector electrode of transistor 37 is applied to the load circuit which is connected between output terminal 43 and ground terminal 44. This change in voltage appearing at the collector electrode of transistor 37 is again fed back through line 32 to the emitter electrode of transistor 13. Signal returned to the emitter electrode of transistor 13 in this manner provides a unity feedback ratio which, in turn, determines the gain of the circuit.

Continually varying waveforms applied through coupling capacitor 15 to the base electrode of transistor 13, thus cause transistors 31 and 37 to be alternately conductive and cutoff in opposite phase relationship. Since transistors 31 and 37 are connected substantially in the common emitter configuration, each of the transistors, when in the conducting state, provides forward gain which is much greater than unity. In addition, transistor 13 operates upon the applied signal to provide gain which is much greater than unity. Thus the gain around the loop which comprises transistor 13, either transistor 37 or transistor 31, and feedback path 32, remains substantially constant over the cycle of the input signal and has a value that is very much greater than unity. Since the gain of the overall circuit between input terminal 9 and output terminal 43 is substantially unity, the gain provided by transistor 13 and either transistor 37 or transistor 31 appears as loop gain. The loop gain of the circuit thus serves to stabilize the overall gain, reduce the signal distortion, increase the input impedance, and decrease the output impedance.

For small, continually varying signals appearing at input terminal 9, transistor 31 is driven through coupling capacitor 33 by transistor 13. The signal may be of sufficiently small value to preclude transistor 31 from turning off and transistor 37 from turning on hard. As a result, the power delivered to the load is provided substantially by transistor 31 which thus operates over the full signal cycle. This gives rise to low distortion signals at low signal levels where small perturbations in the output signal, due to circuit nonlinearities, would be more readily apparent.

The full load power that is supplied to the load circuit connected between output terminal 43 and ground terminal 44 is much greater than the power supplied by either transistor 31 or transistor 37, since each transistor is only required to operate over substantially half of the signal cycle. Thus, for a small bias current flowing from power supply terminal 21 through the circuit to power supply terminal 17, a load current of greater magnitude than the bias current is available at the output terminal. This characteristic makes the circuit specially suited for operation on a battery supply.

Therefore, the circuit of the present invention provides an output or power amplifier which has extremely low output impedance and relatively high input impedance. The large amount of feedback used in the present invention reduces the signal distortion which is produced by the inherent non-linearities of the circuit and serves to reduce the variations in output impedance which normally result from changes in the ambient temperature. In addition, the peak output or load current provided by the present circuit has a value under full signal conditions that exceeds the bias current provided by the power supply. This makes the circuit of the present invention particularly suited for operation on battery supplies where low current drain is essential for long battery life.

I claim:

1. A circuit for increasing the power level of signal applied thereto, said circuit comprising first and second semiconductor devices of one conductivity type having base, emitter, and collector electrodes, a third semiconductor device of opposite conductivity type having base, emitter, and collector electrodes, means including a resistor connected to the emitter electrode of the second semiconductor device to provide forward conduction current through said first and second semiconductor devices, means to provide a forward conduction current through said third semiconductor device that is substantially smaller than the forward conduction current through said second semiconductor device, means to apply said signal to the base electrode of said first semiconductor device, means connecting the base electrode of said second semiconductor device to the collector electrode of said first semiconductor device, means connecting the base electrode of the third semiconductor device to the collector electrode of said first semiconductor device, said second and third semiconductor devices being adapted to provide voltage gains that are substantially greater than unity, means to apply a steady voltage to the base electrode of said second semiconductor device, means forming a common connection of the collector electrodes of said second and third semiconductor devices, a load circuit, means connecting said common connection and said load circuit, and signal and direct current conducting means providing a feedback path between said common connection and the emitter electrode of said first semiconductor device.

2. A circuit for increasing power level of signals applied to a load circuit in response to input signals, said circuit comprising first and second transistors of one conductivity type having base, emitter, and collector electrodes, a third transistor of opposite conductivity type having base, emitter, and collector electrodes, a direct current power supply having output terminals, a source of reference potential, signal conducting means connecting the base electrodes of said second and third transistors, means connecting the emitter electrode of said first transistor and the collector electrodes of said second and third transistors, resistive means connecting the emitter electrode of said second transistor and one output terminal of said power supply, means connecting the emitter electrode of said third transistor and other output terminal of said power supply, signal conducting means to apply said input signal between the base electrode of said first transistor and said source of reference potential, a first voltage divider connected between the output terminals of said power supply adapted to apply a portion of the voltage thereof to the base electrode of said first transistor, a second voltage divider connected between the output terminals of said power supply adapted to apply a portion of the voltage thereof to the base electrode of said second transistor, a resistor connecting the collector electrode of said first transistor and said other output terminal of said power supply, means connecting the collector electrode of said first transistor and the base electrode of said third transistor, and signal conducting means to apply the signal appearing upon the collector electrodes of said second and third transistors to said load circuit.

3. A power amplifying circuit comprising first and second transistors of one conductivity type having base emitter and collector electrodes, a third transistor of opposite conductivity type having base emitter and collector electrodes, a direct current power supply having output terminals, a source of reference potential, means connecting the emitter electrode of said first transistor and the collector electrodes of said second and third transistors, a first resistor in shunt with a bypass capacitor connecting the emitter electrode of said second transistor and one output terminal of said power supply, a unilateral conduction device connecting the emitter electrode of said third transistor and the other output terminal of said power supply, signal conducting means to apply said input signal between the base electrode of said first transistor and said source of reference potential, a first voltage divider connected between the output terminals of said power supply and adapted to apply a portion of the voltage thereof to the base electrode of said first transistor, a second voltage divider connected between the output terminals of said power supply and adapted to apply a portion of the voltage thereof to the base electrode of said second transistor, a second resistor connecting the collector electrode of said first transistor and said other output terminal of said power supply, means connecting the collector electrode of said first transistor and the base electrode of said third transistor, a first coupling capacitor connecting the base electrodes of said second and third transistors, said second and third transistors being adapted to alternate between the conducting state and the non-conducting state in opposite phase relationship in response to the signal appearing on the base electrodes thereof, a load circuit, and a second coupling capacitor serving to apply the signal appearing on the collector electrodes of said second and third transistors to said load circuit.

4. A circuit according to claim 3 wherein said unilateral conduction device is a semiconductor diode connected to conduct in the forward biased state.

5. A power amplifying circuit comprising first and second transistors of one conductivity type having base, emitter, and collector electrodes, a third transistor of opposite conductivity type having base, emitter, and collector electrodes, a direct current power supply having output terminals, said collector electrodes of said second and third transistors being commonly connected, a first resistor shunted by a first capacitor connecting the emitter electrode of said first transistor and one terminal of said power supply, a diode connecting the emitter electrode of said third transistor and other terminal of said power supply, said diode being adapted to conduct forward bias current, a second resistor connecting the base electrode of said second transistor and said one terminal of said power supply, a third resistor connecting the base electrode of said second transistor and the other output terminal of said power supply, a fourth resistor connecting the base electrode of said first transistor to said one terminal of said power supply, a fifth resistor connecting the base electrode of said first transistor and said other output terminal of said power supply, input and output terminals, a second capacitor connecting said input terminal and the base electrode of said first transistor, a sixth resistor connecting the collector electrode of said first transistor and said other output terminal of said power supply, a third capacitor connecting the collector electrode of said first transistor and the base electrode of said second transistor, the base electrode of said third transistor being connected to the collector electrode of said first transistor, a fourth capacitor connecting the common collector electrode of said second and third transistors and said output terminal, and signal and direct current conducting means providing a feedback path from the commonly connected collector electrodes of said second and third transistors to the emitter electrode of said first transistor.

6. A power amplifying circuit comprising first and second transistors of one conductivity type having base, emitter, and collector electrodes, a third transistor of opposite conductivity type having base, emitter and collector electrodes, a direct current power supply having output terminals, said collector electrodes of said second and third transistors being commonly connected, a first resistor shunted by a first capacitor connecting the emitter electrode of said first transistor and one terminal of said power supply, a diode connecting the emitter electrode of said third transistor and the other terminal of said power supply, said diode being adapted to conduct forward bias current, a second resistor connecting the base electrode of said second transistor and said one terminal of said power supply, a third resistor connecting the base electrode of said second transistor and the other output terminal of said power supply, a fourth resistor connecting the base electrode of said first transistor to said one terminal of said power supply, a fifth resistor connecting the base electrode of said first transistor and said other output terminal of said power supply, input and output terminals, a direct connection between said input terminal and the base electrode of said first transistor, a sixth resistor connecting the collector electrode of said first transistor and said other output terminal of said power supply, a second capacitor connecting the collector electrode of said first transistor and the base electrode of said second transistor, the base electrode of said third transistor being connected to the collector electrode of said first transistor, a direct connection between the common collector electrode of said second and third transistors and said output terminal, and signal and direct current conducting means providing a feedback path from the commonly connected collector electrodes of said second and third transistors to the emitter electrode of said first transistor.

7. A circuit for amplifying an input signal, said circuit comprising first and second transistors of one conductivity type and a third transistor of complementary conductivity type, each having base and emitter electrodes forming an input circuit and having emitter and collector electrodes forming an output circuit, a power supply having a pair of terminals, means including a resistor connected to the emitter electrode of said second transistor and serially connecting the output circuits of the first and second transistors between said pair of terminals, means including said resistor and serially connecting the output circuits of the second and third transistors between said pair of terminals, means to apply a steady voltage to the base electrode of said second transistor, means to apply the signal from the output circuit of the first transistor to the input circuits of the second and third transistors, means connecting together the collector electrodes of said second and third transistors, means connected to the commonly-connected collector electrodes of the second and third transistors for deriving an output signal therefrom, and means to apply to the input circuit of the first transistor the combination of said input signal and a signal from the collector electrodes of the second and third transistors.

8. A circuit for amplifying an input signal, said circuit comprising first and second transistors of one conductivity type and a third transistor of complementary conductivity type, each having base and emitter electrodes forming an input circuit and having emitter and collector electrodes forming an output circuit, a power supply having a pair of terminals, means including a resistor connected to the emitter electrode of said second transistor and serially connecting the output circuits of the first and second transistors between said pair of terminals, means including said resistor and serially connecting the output circuits of the second and third transistors between said pair of terminals, the collector electrodes of said second and third transistors being connected together, a voltage divider connected between said terminals for applying a steady voltage to the base electrode of said second transistor, the combination of said steady voltage and said resistor being adapted to limit the maximum current through said second transistor, means to apply the signal from the output circuit of the first transistor to the input circuits of the second and third transistors, said second and third transistors being adapted to change conductivity in opposite phase relationship in response to the signal applied to the input circuits thereof, means connected to the commonly-connected collector electrodes of the second and third transistors for deriving an output signal therefrom, and means to apply said input signal and a signal from the collector electrodes of the second and third transistors to the input circuit of the first transistor.

References Cited in the file of this patent

UNITED STATES PATENTS

| | | |
|---|---|---|
| 2,851,542 | Lohman | Sept. 9, 1958 |
| 2,860,193 | Lindsay | Nov. 11, 1958 |

OTHER REFERENCES

"Electronics," August 1, 1957, page 162 relied on.